United States Patent
Chen

(10) Patent No.: US 7,236,357 B2
(45) Date of Patent: Jun. 26, 2007

(54) REPLACING-TYPE UPPER COVER PLATE STRUCTURE OF NOTEBOOK COMPUTER

(75) Inventor: Hsiang Chen, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/181,714

(22) Filed: Jul. 13, 2005

(65) Prior Publication Data
US 2007/0014079 A1    Jan. 18, 2007

(51) Int. Cl.
*G06F 1/16* (2006.01)
(52) U.S. Cl. ............... 361/683; 361/681; 312/223.1
(58) Field of Classification Search .......... 361/683
See application file for complete search history.

(56) References Cited

U.S. PATENT DOCUMENTS

| | | | | |
|---|---|---|---|---|
| 5,844,772 A * | 12/1998 | Lee et al. | ............ | 361/683 |
| 5,870,282 A * | 2/1999 | Andre et al. | ............ | 361/683 |
| 5,903,097 A * | 5/1999 | Lee | ............ | 313/493 |
| 6,152,550 A * | 11/2000 | Yamaguchi | ............ | 312/223.2 |
| 6,791,825 B1 * | 9/2004 | Taylor | ............ | 361/681 |
| 6,958,570 B2 * | 10/2005 | Kijima et al. | ............ | 313/292 |
| 7,016,184 B1 * | 3/2006 | Oneyama et al. | ............ | 361/683 |
| 2002/0186526 A1 * | 12/2002 | Kim | ............ | 361/681 |
| 2005/0213291 A1 * | 9/2005 | Chi | ............ | 361/681 |
| 2006/0193109 A1 * | 8/2006 | Bander et al. | ............ | 361/681 |

* cited by examiner

*Primary Examiner*—Anatoly Vortman
*Assistant Examiner*—Anthony Q. Edwards
(74) *Attorney, Agent, or Firm*—Venable LLP

(57) ABSTRACT

A replacing-type upper cover plate structure of notebook computer is disclosed. It includes a cover plate having an embedded element, and a containing frame having a groove bonding with the embedded element. The replacing-type upper cover plate structure, through a preferred module bonding mode, makes the upper and the lower shell tight-fit to bond for achieving the efficacy of protecting the interior and exterior elements of the cover plate. In the meantime, since the replacing mode of the cover plate is simple, convenient, and fast, thereby, the invention can improve the users' working efficiency to meet the humanized requirement.

8 Claims, 7 Drawing Sheets

REPLACING-TYPE UPPER COVER PLATE STRUCTURE OF NOTEBOOK COMPUTER

BACKGROUND OF THE INVENTION

1. Field of the Invention

The invention relates to a replacing-type upper cover plate structure of notebook computer, and more particularly, to a humanized design of replacing-type cover plate structure of notebook computer making use of a preferred bonding mode of the cover plate to make the module completely tight-fit to bond while easy to assemble and disassemble, and can change its appearance to meet the users' requirement.

2. Description of the Prior Art

Following the change with each passing day and month in the progress of the information science and technology, the relation between the contemporary men and the computer is getting closer than ever. Therefore, the function and conveniency of the computer, especially the notebook computer, is important accordingly. Particularly, since one always carries the notebook computer hustle and bustle on an errand bound while going to work, taking bus, having business trip, or presenting a brief etc, at this moment, the notebook computer has to provide the conveniency to carry it along, and in the meantime, to meet the humanized requirement for fast assembling and disassembling.

FIG. 1 is a schematic diagram of the fastening mode of hooking of the prior art. As shown in FIG. 1, the notebook computer comprises an upper cover plate 11 and a body 12. The upper cover plate 11 is used to apply to a notebook computer for fixing its liquid crystal display (LCD). Wherein the upper cover plate has a first connecting rod 13 and a second connecting rod 14 connected with the first connecting rod 13. The second connecting rod 14 contains a square hole 15. In addition, the body 12 contains a fillister 16 and there is bump 17 inside the fillister 16. The bump 17 is fastened to the square hole 15 of the second connecting rod 14 in order to hook the upper cover plate 11 and the body 12. The whole set of cover-body module, by the use of this mode, can be tightly bonded. On the other hand, when the first connecting rod 13 is pushed by an outside force, the second connecting rod 14 will be pushed together. Then, the upper cover plate 11 will unhook the body 12 and the notebook computer can be opened.

The assembly and disassembly of the connecting rods are difficult because they relate to the actions of taking out and hooking up of the rods, which causes the process becomes more complicated and inconvenient for users. Moreover, the fact that the edges of the cover plate structure of the prior art are not quite tightly bonded is apt to cause the intrusion of the contaminated articles.

SUMMARY OF THE INVENTION

In view of the above-mentioned problems of the prior art, the objective of the invention is to provide a replacing-type upper cover plate structure of notebook computer to improve the disadvantage of the prior art. The disadvantage of the prior art is that the assembling process is so complicated that the assembling and disassembling work is not easy to undertake, and there is an insufficiency that the open and close of the cover-body module can not achieve a completely tight-fit to bonding.

To achieve the above-mentioned objective, the replacing-type upper cover plate structure of notebook computer of the invention includes a cover plate having an embedded element, and a containing frame having a groove bonding with the embedded element.

The replacing-type upper cover plate structure of notebook computer disclosed by the invention has a lot of advantage. At first, it makes use of the preferred upper and lower cover-plate bonding mode to positively press-to-fit to bond the cover-body module. In the meantime, since the replacement of the module elements is easy and fast, one not only can quickly disassemble to replace elements without using any tool when it comes to use, but also can engrave their specific names or marks on its different upper and lower cover plates. Moreover, it possesses the efficacy that it can arbitrary change its appearance in order to differentiate different computers having the same pattern. What is more, by having the design that one can outstandingly express ones personal style, it can effectively stimulate the customers' purchasing desire.

The accomplishment of this and other objectives of the invention will become apparent from the following description and its accompanying drawings of which

DETAILED DESCRIPTION OF THE PREFERRED EMBODIMENT

Figure 1:
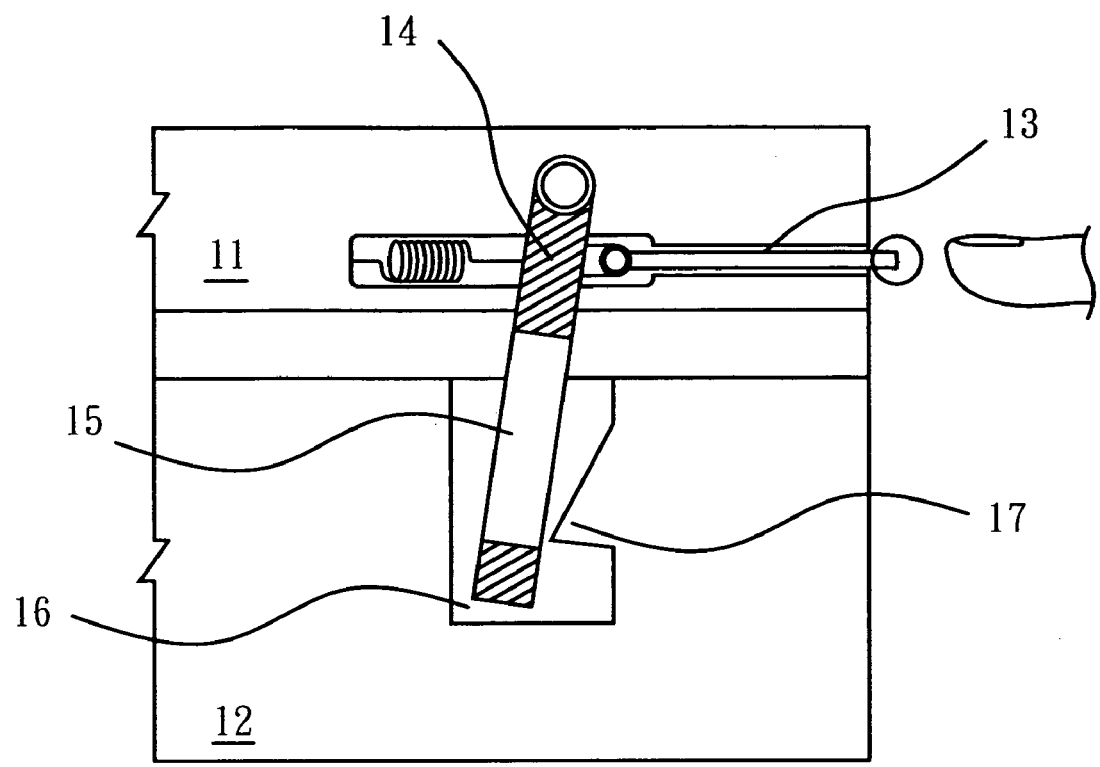
FIG. 1 is a schematic diagram of the fastening mode of bonding of the prior art.
Figure 2:
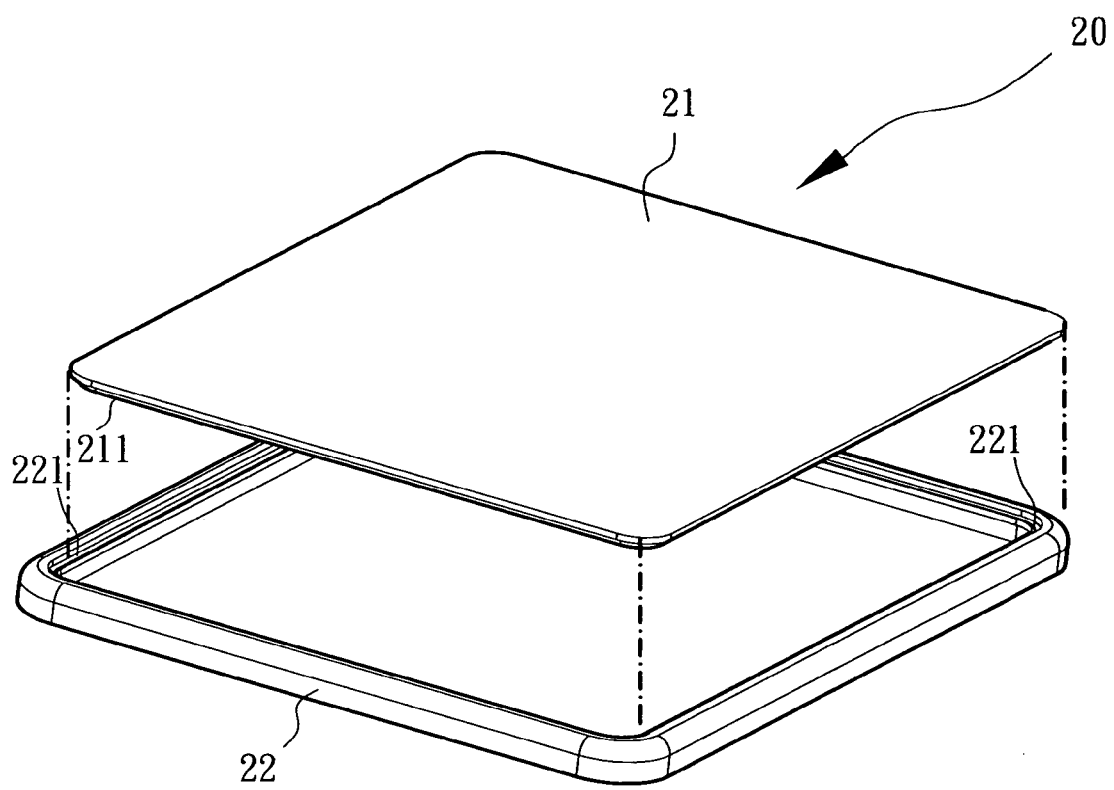
FIG. 2 is an isometric exploded view of the first embodiment of the invention.

FIG. 2 is an isometric exploded view of the first embodiment of the invention. As shown in FIG. 2, the invention includes a cover plate (21) that provides an embedding element having a press-to-fit element containing a clamping stripe (211), and a containing frame (22) having a groove (221) for containing the clamping stripe (211) at its edge to constitute a tight-fit to bonding cover-body module (20). After the tight-fit to bonding cover-body module (20) positively bonding by making use of the clamping stripe (211) and the groove (221), the characteristic of being not apt to generate chink can exactly eliminate the external stress at the edge. The fact that the protective cover shell body is not apt to slip-to-open or slip-to-drop can achieve the efficacy of tight-fit to bonding and protecting the cover plate's interior element. The material for the tight-fit to bonding module can be metal or plastics.

Figure 3:
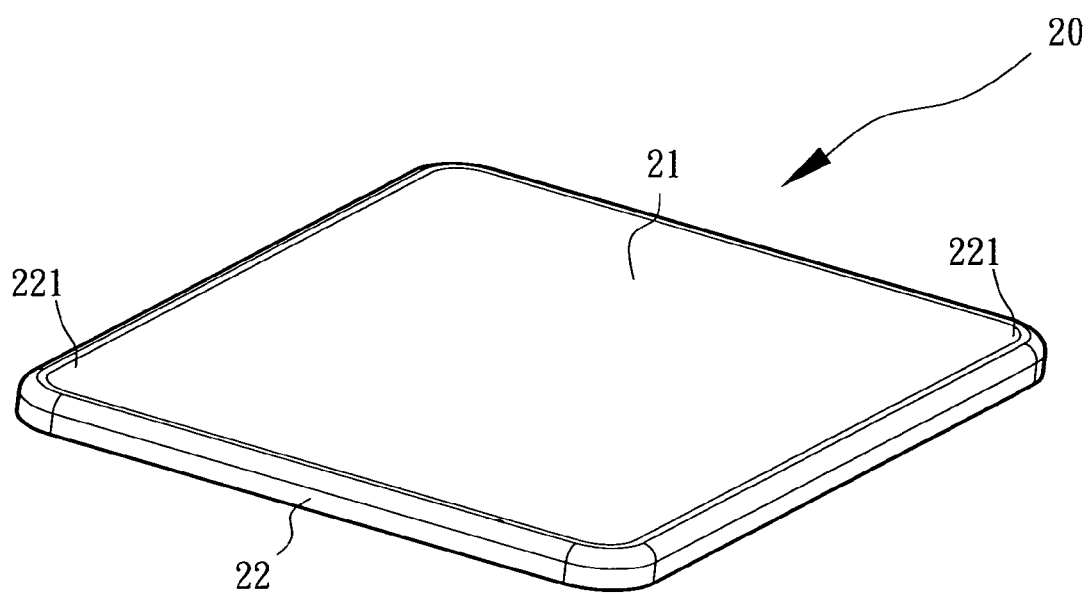
FIG. 3 is an isometric view after being assembled of the first embodiment of the invention.

FIG. 3 is an isometric view after being assembled of the first embodiment of the invention. As shown in FIG. 3, the cover plate (21) tight-fit to bonds the containing frame (22) after completing the press bonding, the appearance looks integrated, pleasing to the eyes, and more convenient for carrying. Besides, the cover-body module (20) will not loose to open and drop abruptly.

Figure 4:
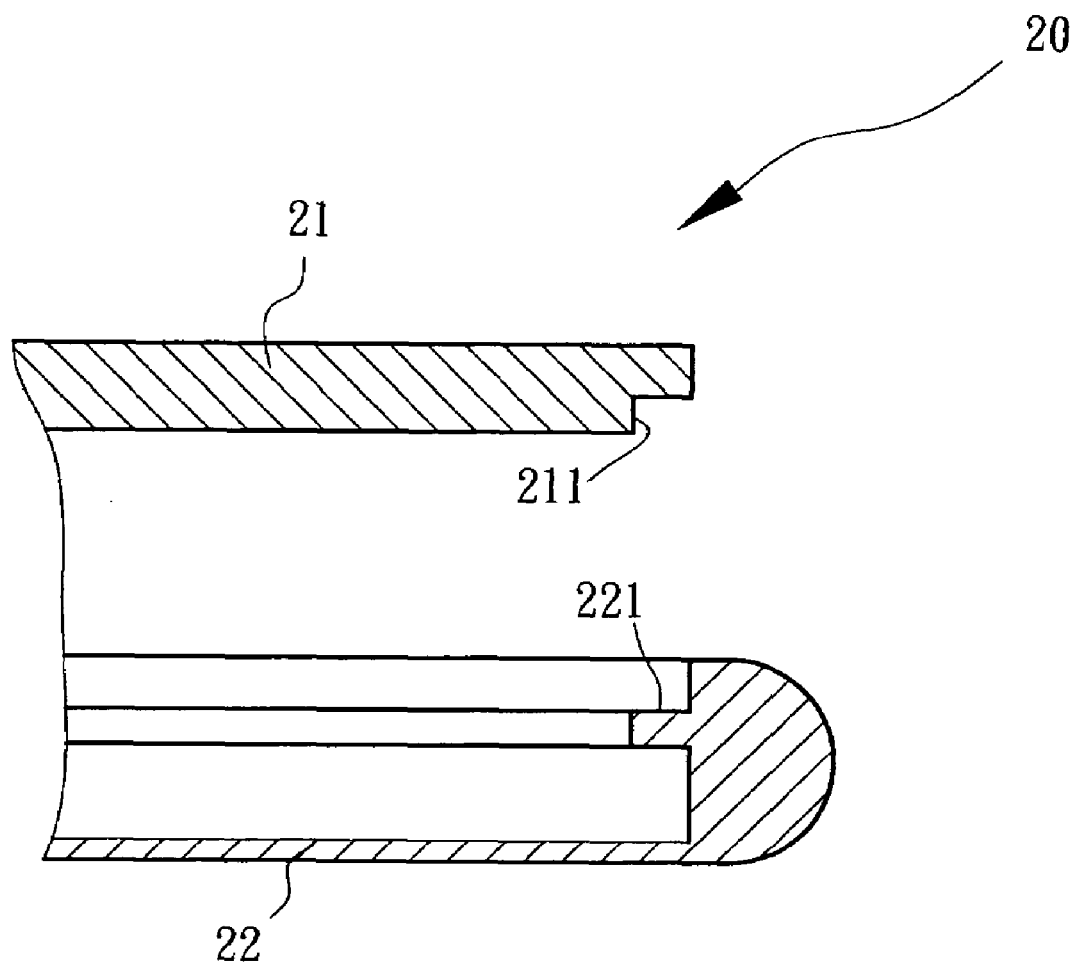
FIG. 4 is a transverse cross-sectional view before being assembled of the first embodiment of the invention.

FIG. 4 is a transverse cross-sectional view before being assembled of the first embodiment of the invention. As shown in FIG. 4, through the press-to-fit mode, the clamping stripe (211) seals and bonds with the groove (221), thereby, the edge will not generate chink, and the interior and exterior portions are completely fitted to bond.

Figure 5:
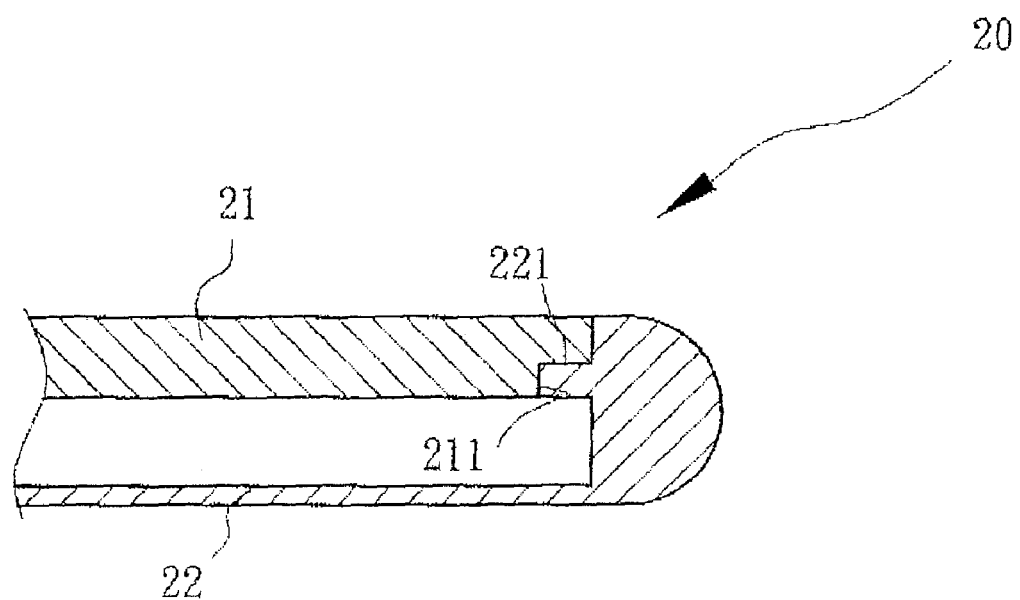
FIG. 5 is a transverse cross-sectional view of the compression fitting seal module of the first embodiment of the invention.

FIG. 5 is a transverse cross-sectional view of the compression fitting seal module of the first embodiment of the invention. As shown in FIG. 5, the groove (221) provides the clamping stripe (211) for containing and press-to-fit becoming a press-to-fit cover-body module (20) system.

Figure 6:
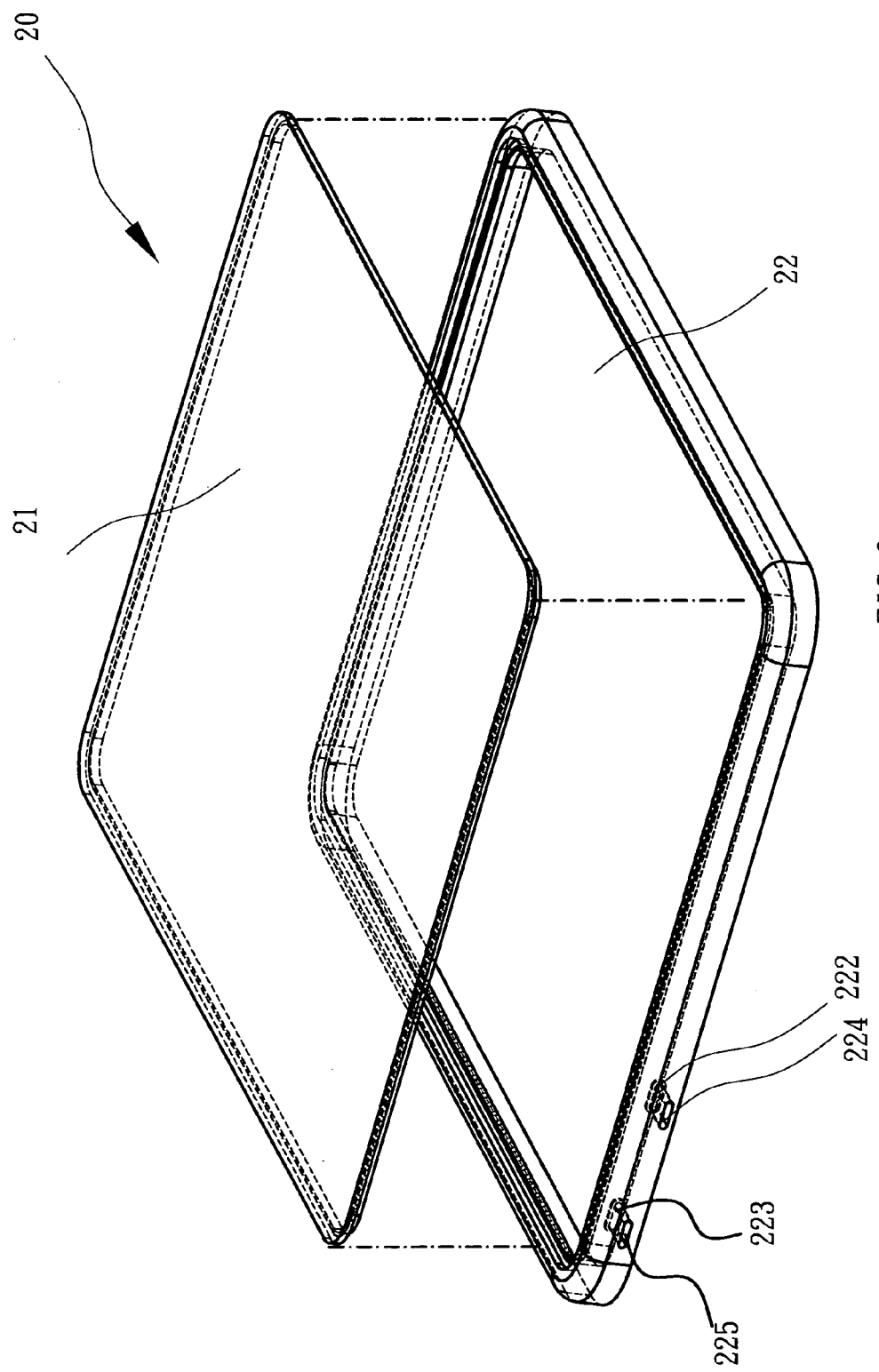
FIG. 6 is an isometric exploded view of the second embodiment of the invention.

FIG. 6 is an isometric exploded view of the first embodiment of the invention. As shown in FIG. 6, the invention includes a cover plate (21) and a containing frame (22). The sides of the containing frame (22) further includes an inlet air hole (222) and an outlet air hole (223) for serving as airtight mode open-closed system control element. The cover-body module (20) can open when the user fill air through the inlet air hole (222) while the cover-body module (20) can close when the user release gas through the outlet air hole (223). That is the clamping stripe (211) is sealed and bonded with the groove (221) by releasing air inside the containing frame (22) through the outlet air hole. The cover plate (21) is separated from the containing frame (22) through the outlet air hole. The cover plate (21) is separated from the containing frame (22) by filling air into the containing frame (22) through the inlet air hole. In the meantime, an inlet air hole cap (224) and an outlet air hole cap (225) are provided for the inlet air hole (222) and the outlet air hole (223) respectively to avoid the air leaking or the entering of the contaminants.

Figure 7:
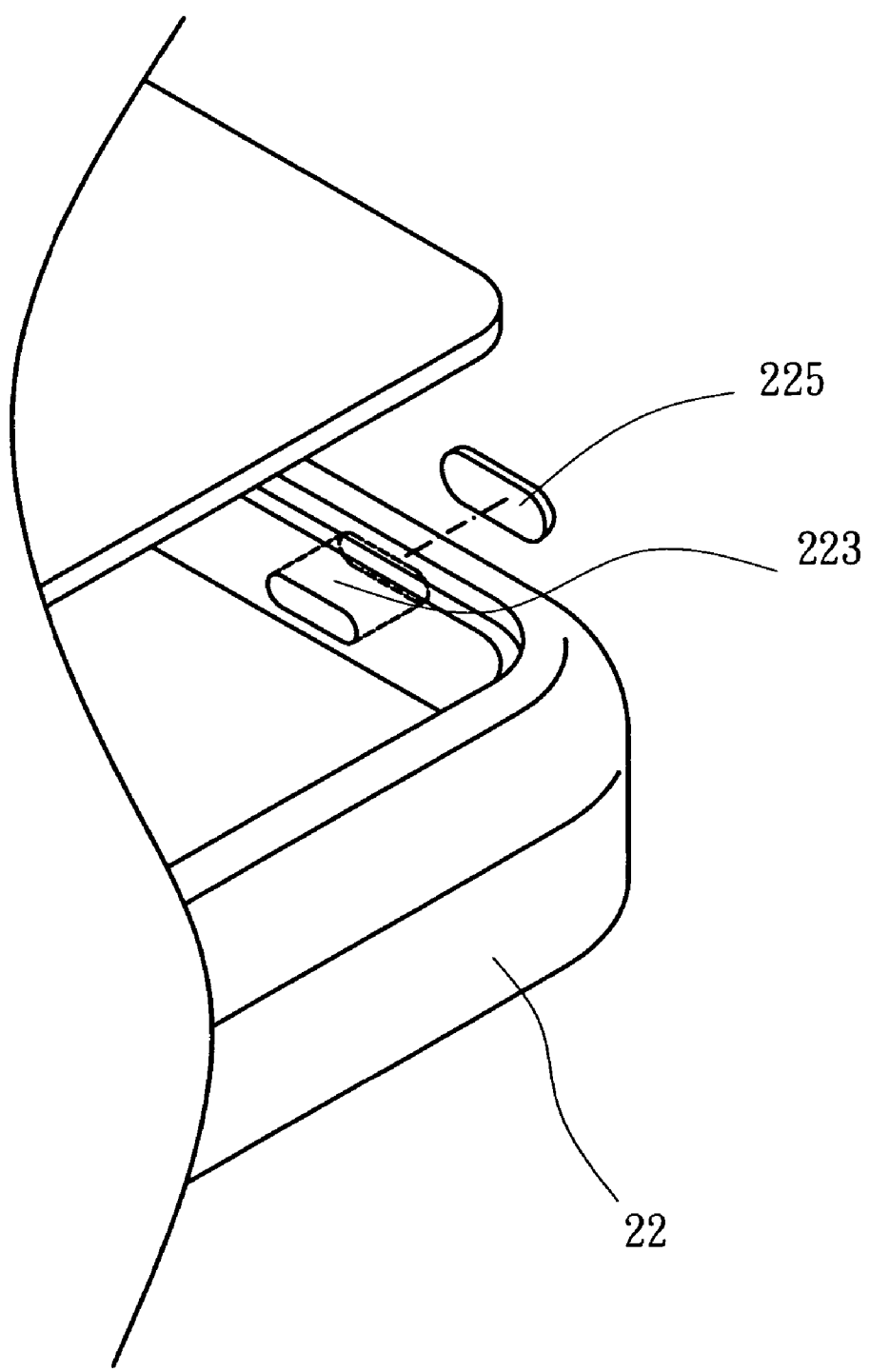
FIG. 7 is a partially enlarged isometric view showing the location of the air hole of the second embodiment of the invention.

FIG. 7 is a partially enlarged isometric view showing the location of the air hole of the second embodiment of the invention. As shown in FIG. 7, the sides of the containing frame (22) further includes an outlet air hole (223) for serving as airtight mode open-closed system control element. In the meantime, an outlet air hole cap (225) is provided for the outlet air hole (223) to avoid the air leaking or the intrusion of the contaminants.

Through the foregoing bonding application of the two embodiments of the invention, it is apparent that the cover-body module of the invention can completely press to fit disregarding whether it is at the circumferential exterior edge or in the interior space. This can compensate and reinforce the disadvantage of the prior art that its cover plate module cannot tight fit to bond. In addition, the interior elements, because of its tight-fit pressed bonding, will not be compressed by external forces, will not be damaged, and will not be infiltrated by the dirt. What is more, the location of the air holes can dispose flexibly without affecting the usage of the computer's inserting slots that may cause users' inconvenience.

To sum up, the replacing-type upper cover plate structure disclosed by the invention making use of the preferred upper and lower cover plate bonding mode can positively press-to-fit to bond the cover-body module 20. In the meantime, since the replacement of the module elements is easy and fast, one not only can quickly disassemble to replace elements without using any tool when it comes to use, but also can engrave their specific names or marks on its upper cover plates. Moreover, it possesses the efficacy that it can arbitrary change its appearance in order to differentiate different computers having the same pattern. What is more, by having the design that one can outstandingly express ones personal style, it can effectively stimulate the customers' purchasing desire. It is apparent that the cover plate module of the invention has possessed prominent efficacy as one compares with the cover plate module of the prior art.

It will become apparent to those people skilled in the art that various modifications and variations can be made to the structure of the invention without departing from the scope or spirit of the invention. In view of the foregoing description, it is intended that all the modifications and variation fall within the scope of the following appended claims and their equivalents.

What is claimed is:

1. A replacing-type upper cover plate structure of notebook computer, comprising:
   a cover plate, having a clamping stripe; and
   a containing frame of the notebook computer, having a groove, an outlet air hole and an inlet air hole, said clamping stripe sealed and bonded with said groove by releasing air inside said containing frame through said outlet air hole, said cover plate separated from said containing frame by filling air into said containing frame through said inlet air hole.

2. The replacing-type upper cover plate structure of notebook computer as claimed in claim 1, wherein said cover plate is made of metal material.

3. The replacing-type upper cover plate structure of notebook computer as claimed in claim 1, wherein said cover plate is made of plastics.

4. The replacing-type upper cover plate structure of notebook computer as claimed in claim 1, wherein the bonding for connecting said cover plate and said containing frame is a press-to-fit mode.

5. The replacing-type upper cover plate structure of notebook computer as claimed in claim 1, wherein the bonding for connecting said cover plate and said containing frame is an airtight mode.

6. The replacing-type upper cover plate structure of notebook computer as claimed in claim 5, wherein further comprising an outlet air hole cap and an inlet air hole cap, said outlet air hole cap and said inlet air hole cap respectively provided for said outlet air hole to avoid air leaking or entering of contaminants.

7. The replacing-type upper cover plate structure of notebook computer as claimed in claim 1, wherein said containing frame is made of metal material.

8. The replacing-type upper cover plate structure of notebook computer as claimed in claim 1, wherein said containing frame is made of plastics.

* * * * *